(12) United States Patent
Arvin et al.

(10) Patent No.: US 11,410,894 B2
(45) Date of Patent: Aug. 9, 2022

(54) POLYGON INTEGRATED CIRCUIT (IC) PACKAGING

(71) Applicant: International Business Machines Corporation, Armonk, NY (US)

(72) Inventors: Charles L. Arvin, Poughkeepsie, NY (US); Richard F. Indyk, Saratoga Springs, NY (US); Bhupender Singh, Fishkill, NY (US); Jon A. Casey, Poughkeepsie, NY (US); Shidong Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 16/562,583

(22) Filed: Sep. 6, 2019

(65) Prior Publication Data

US 2021/0074599 A1  Mar. 11, 2021

(51) Int. Cl.
| | |
|---|---|
| *H01L 23/34* | (2006.01) |
| *H01L 23/13* | (2006.01) |
| *H01L 23/373* | (2006.01) |
| *H01L 23/367* | (2006.01) |
| *G06F 3/00* | (2006.01) |
| *H01L 23/00* | (2006.01) |
| *H01L 25/065* | (2006.01) |

(52) U.S. Cl.
CPC .............. *H01L 23/13* (2013.01); *G06F 3/002* (2013.01); *H01L 23/367* (2013.01); *H01L 23/373* (2013.01); *H01L 24/49* (2013.01); *H01L 24/85* (2013.01); *H01L 25/0655* (2013.01)

(58) Field of Classification Search
CPC ....... H01L 23/13; H01L 23/367; H01L 24/49; H01L 24/85; H01L 25/0655; H01L 23/373; G06F 3/002
USPC ........................................................ 257/713
See application file for complete search history.

(56) References Cited

U.S. PATENT DOCUMENTS

| | | |
|---|---|---|
| 4,499,607 A | 2/1985 | Higgins |
| 5,710,071 A | 1/1998 | Beddingfield et al. |
| (Continued) | | |

FOREIGN PATENT DOCUMENTS

WO    2005038926 A1    4/2005

OTHER PUBLICATIONS

Chen et al., "Two-Dimensional Packing For Irregular Shaped Objects", IEEE 2002.

(Continued)

*Primary Examiner* — Calvin Y Choi
(74) *Attorney, Agent, or Firm* — Matthew Zehrer

(57) ABSTRACT

An electronic system includes two integrated circuit (IC) packages that are connected by a package to package (PP) connector. The PP connector may include cabling between a first cabling connector and a second cabling connector. The first cabling connector may be seated to a first carrier connector upon a first IC device carrier of the first IC device package. The second cabling connector may be seated to a second carrier connector upon a second IC device carrier of the second IC device package. The electronic system may further include a heat sink connected to the IC packages, to the first cabling connector, and to the second cabling connector. An IC device may route I/O data through the PP connector, effectively increasing the number of I/O routes.

8 Claims, 12 Drawing Sheets

(56) References Cited

U.S. PATENT DOCUMENTS

| | | | |
|---|---|---|---|
| 5,772,451 A * | 6/1998 | Dozier, II | H01L 21/4889 |
| | | | 439/70 |
| 5,834,843 A | 11/1998 | Mori et al. | |
| 6,030,885 A | 2/2000 | Bothra | |
| 6,407,434 B1 | 6/2002 | Rostoker et al. | |
| 6,462,398 B1 | 10/2002 | Jojiki | |
| 6,967,494 B2 * | 11/2005 | Kline | H01L 23/49805 |
| | | | 324/754.18 |
| 7,208,346 B2 | 4/2007 | Lee | |
| 7,608,919 B1 | 10/2009 | Bernstein et al. | |
| 8,193,613 B2 | 6/2012 | Wang et al. | |
| 8,417,071 B2 * | 4/2013 | Hopkins | G02B 6/12 |
| | | | 385/14 |
| 9,437,493 B2 | 9/2016 | Grivna et al. | |
| 9,875,969 B2 | 1/2018 | Braunisch et al. | |
| 9,911,716 B2 | 3/2018 | Davis et al. | |
| 2007/0293131 A1 | 12/2007 | Hoglund | |
| 2013/0249079 A1 | 9/2013 | Lee et al. | |
| 2014/0217557 A1 | 8/2014 | Chen et al. | |
| 2014/0321093 A1 | 10/2014 | Pande et al. | |
| 2015/0008571 A1 | 1/2015 | Gallegos et al. | |
| 2015/0145115 A1 | 5/2015 | Liu et al. | |
| 2015/0179609 A1 | 6/2015 | Holm et al. | |
| 2015/0206807 A1 | 7/2015 | Ahn et al. | |
| 2016/0042978 A1 | 2/2016 | Wang et al. | |
| 2017/0186705 A1 | 6/2017 | Malatkar et al. | |

OTHER PUBLICATIONS

S. Sidiropoulos, "High Performance Inter-Chip Signaling," Technical Report: CSL-TR-760, Computer Systems Laboratory, Departments of Electrical Engineering and Computer Science, Stanford University, Apr. 1998.

X. Gu et al., "High-density silicon carrier transmission line design for chip-to-chip interconnects," IEEE 20th Conference an Electrical Performance of Electronic Packaging and Systems (EPEPS), 2011.

* cited by examiner

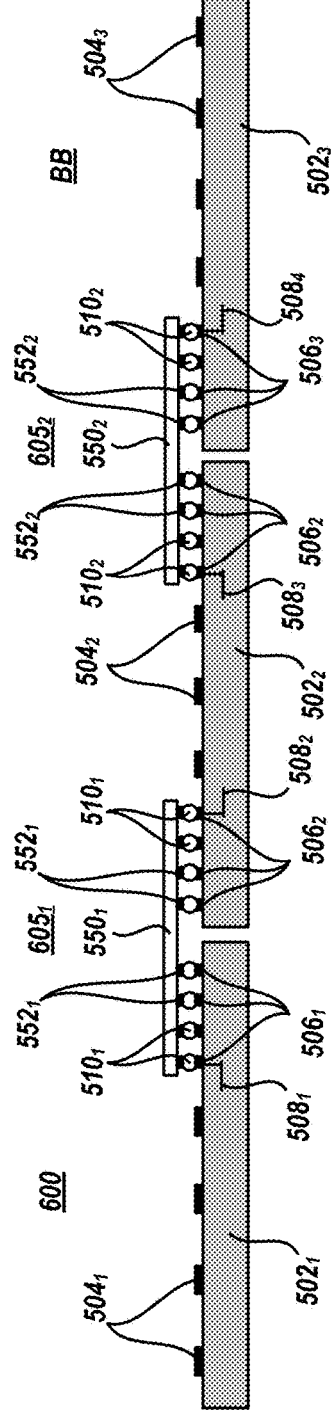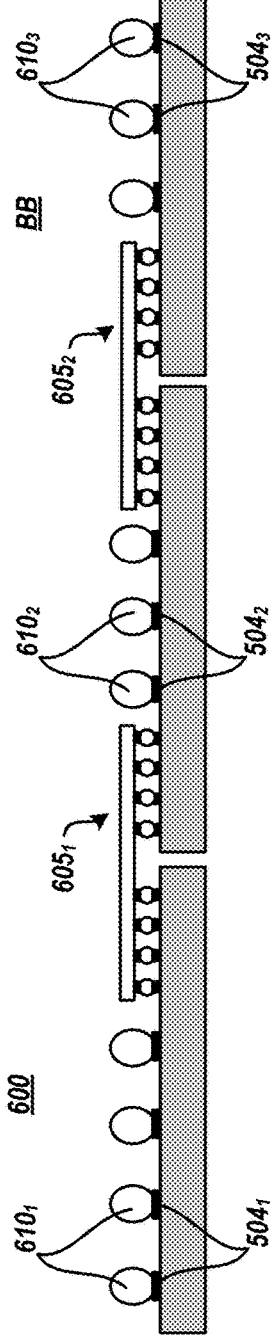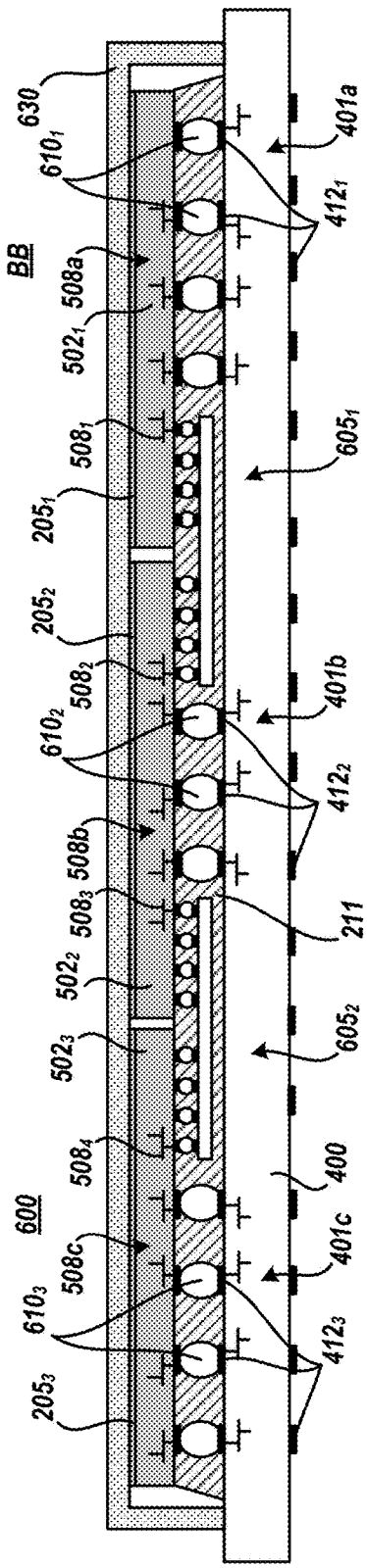

POLYGON INTEGRATED CIRCUIT (IC) PACKAGING

FIELD OF THE EMBODIMENTS

Embodiments of the present invention generally relate to integrated circuit (IC) device packages, and more particularly to an IC device package that includes a polygon IC device and/or a polygon IC carrier.

DESCRIPTION OF THE RELATED ART

Future requirements for data handling systems may force IC packaging design changes, such as reduction of size of IC packaging system, reduction of the number of input/output (I/O) between the IC device and the IC device carrier, etc. Typical IC device and IC carrier manufacturing has required or resulted in rectangular or square designs. However, the square corners of these designs typically do not allow for I/O therefrom.

SUMMARY

In an embodiment of the present invention, an electronic system is presented. The system includes a first integrated circuit (IC) device package, a second IC device package, and a package to package (PP) connector. The first IC device package includes a first carrier, a first IC device connected to a top surface of the first carrier (first carrier top surface), a first cover connected to the first IC device and connected to the first carrier top surface, and a first carrier connector connected to the first carrier top surface. The second IC device package includes a second carrier, a second IC device connected to a top surface of the second carrier (second carrier top surface), a second cover connected to the second IC device and connected to the second carrier top surface, a second carrier connector connected to the second carrier top surface. The PP connector includes cabling connected to a first cabling connector and a second cabling connector. The first cabling connector is seated to the first carrier connector and the second cabling connector is seated to the second carrier connector.

In another embodiment of the present invention, an electronic system fabrication method is presented. The method includes connecting a first integrated circuit (IC) device package to a system board, connecting a second IC device package to the system board, seating a first cabling connector of a package to package (PP) connector to the first carrier connector, and seating a second cabling connector of the PP connector to the second carrier connector. The first IC device package includes a first carrier, a first IC device connected to a top surface of the first carrier (first carrier top surface), a first cover connected to the first IC device and connected to the first carrier top surface, and a first carrier connector connected to the first carrier top surface. The second IC device package includes a second carrier, a second IC device connected to a top surface of the second carrier (second carrier top surface), a second cover connected to the second IC device and connected to the second carrier top surface, and a second carrier connector connected to the second carrier top surface. The PP connector includes cabling connected to the first cabling connector and the second cabling connector.

In another embodiment of the invention, a data output method is presented. The method includes receiving, with a first integrated circuit (IC) device package, a request to send data to a destination device. The method further includes sending, with the first IC device package, the data to a second IC device package that neighbors the first IC device package across a package to package (PP) connector. The method further includes sending, with the second IC device package, the data to the destination device.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 11 depicts a cross section view of an IC package at a particular fabrication stage, according to one or more embodiments of the present invention.

FIG. 12 depicts a cross section view of an IC package at a particular fabrication stage, according to one or more embodiments of the present invention.

FIG. 13 depicts a cross section view of an IC package at a particular fabrication stage, according to one or more embodiments of the present invention.

DETAILED DESCRIPTION

An electronic system includes two integrated circuit (IC) packages that are connected by a package to package (PP) connector. The PP connector may include cabling between a first cabling connector and a second cabling connector. The first cabling connector may be seated to a first carrier connector upon a first IC device carrier of the first IC device package. The second cabling connector may be seated to a second carrier connector upon a second IC device carrier of the second IC device package. The electronic system may further include a heat sink connected to the IC packages, to the first cabling connector, and to the second cabling connector. An IC device may route I/O data through the PP connector, effectively increasing the number of I/O routes.

Figure 1:
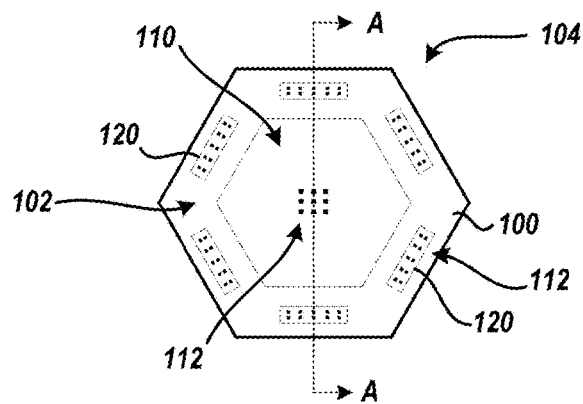
FIG. 1 depicts a normal view of an IC device carrier, according to one or more embodiments of the present invention.

FIG. 1 depicts a normal view of an IC device carrier 100, according to one or more embodiments of the present invention. Carrier 100 has a polygonal normal shape and may be an organic carrier and is configured to carry a single IC device 200, exemplarity shown in FIG. 3B. For example, carrier 100 may have a hexagonal normal shape as depicted. Carrier 100 provides mechanical support for an IC device and includes electrical paths there within. For example, carrier 100 may include electrical paths 101, exemplary shown in FIG. 3B, there within.

Carrier 100 includes an IC device region 110 and one or more connector regions 120. IC device region 110 may be a footprint of the IC device which is supported by carrier 100 and may extend from the top surface 102 to the bottom surface 104 of carrier 100. The surface area of region 110 may be relatively larger upon surface 104 relative to that upon surface 102. IC device region 110 includes contacts 112 upon surface 102 and includes contacts 112 upon surface 104. Contacts within region 110 may be associated with I/O between the IC device and a higher level system or mother board. Within region 110, a path 101 may connect a contact 112 upon surface 102 with a contact 112 upon surface 104. Region 110 may have a polygonal normal shape and may be the same polygonal shape as carrier 100.

Figure 2:
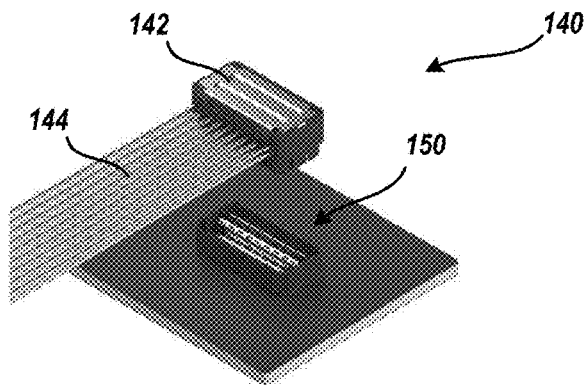
FIG. 2 depicts an isometric view of a package to package connector, according to one or more embodiments of the present invention.

Connector region 120 may be a footprint of a connector of a package to package (PP) connector 150, exemplary shown in FIG. 2, and may extend from the top surface 102 to the bottom surface 104 of carrier 100. The surface area of region 110 may be relatively larger upon surface 104 relative to that upon surface 102. Connector region 120 includes contacts 112 upon surface 102 and may further includes contacts 112 upon surface 104. A contact within region 120 may be associated with I/O between the IC device and a neighboring IC device upon a different neighboring package. Another contact 112 within region 120 may be associated with I/O between the neighboring IC device and the higher level system or mother board. A path 101 may connect a contact 112 upon surface 102 within region 120 with a contact 112 upon surface 102 within region 110. Another path 101 may connect a contact 112 upon surface 102 within region 120 with a contact 112 upon surface 104 within region 120 or within region 110. Contact 112 is electrically conductive and may be a pad, pin, receptacle, socket, or the like.

FIG. 2 depicts an isometric view of PP connector 140, according to one or more embodiments of the present invention. PP connector 140 includes a pair of carrier connectors 150, a pair of cabling connectors 142, and cabling connecting the pair of cabling connectors 142. A first carrier connector 150 is configured to mount to surface 102 of a first carrier 100 and the second carrier connector is configured to mount to surface 102 of a second different carrier 100. Connector 150 may include numerous conductive interconnects, such as wires, or the like, as is known in the art. Each of these conductive interconnects may be electrically connected to a contact 112 or to a path 101 within region 120 of the associated carrier 100. Cabling 144 may include numerous insulated wires, with each connected with a conductive interconnect within connector 142. The connector 142 may be seated to connector 150 such that the interconnect within connector 142 becomes in contact with the interconnect within connector 150. When the first connector 142 is seated upon the first connector 150 and when the second connector 142 is seated upon the second connector 150, numerous electrical paths (provided by PP connector 140) exist between paths 101 of the first carrier 100 and paths 101 of the second carrier 100. Connector 142 may include a major planar top surface. The term "major planar top surface" is defined herein to mean that the majority of the top surface area is on the same plane. The major planar top surface of connector 142 may be parallel with the top surface 102 of carrier 100.

Figures 3A, 3B:
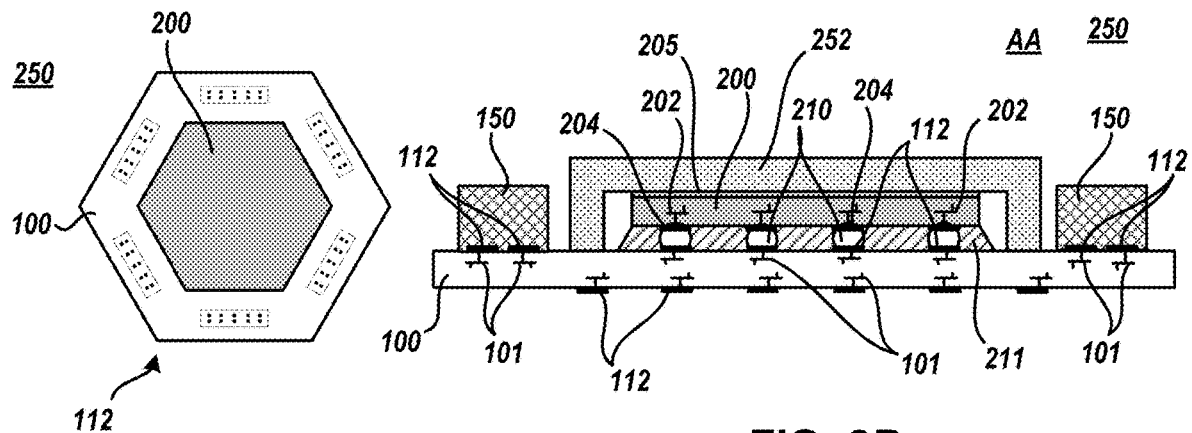
FIG. 3A and FIG. 3B depicts views of an IC package at various fabrication stages, according to one or more embodiments of the present invention.

FIG. 3A and FIG. 3B depicts views of an IC package at various fabrication stages, according to one or more embodiments of the present invention. FIG. 3A depicts a normal view of IC package 250 at a fabrication stage where an IC device 200 is connected to IC device carrier 100. FIG. 3B depicts a cross section view of IC package 250 at a fabrication stage where a cover 252 is connected to the IC device 200 and to the carrier 100 and where connector 150 is connected to carrier 100.

IC device 200 may be an IC chip, die, processor, microchip, field programmable gate array, or other type of data processing or storage device, that is configured to be connected to its own carrier 100. IC device 200 may be connected to carrier 100 by interconnects 210. An interconnect 210 is conductive and is configured to electrically connects a contact 204 of IC device 200 with a contact 112 on the upper surface 102 of carrier 100. Interconnect 210 may be a wire, solder, stud, conductive ball, conductive button, socket, receptacle, or the like. IC device 200 may have a polygonal normal shape and may be the same polygonal shape as carrier 100.

IC device 200 may be further connected to carrier 100 by underfill 211. Underfill 211 may be electrically-insulating, may substantially surround interconnects 210, may isolate individual interconnects 210, and may provide mechanical support between IC device 200 and carrier 100. Underfill 211 may also prevent damage to individual interconnects 210 due to thermal expansion mismatches between IC device 200 and carrier 100.

When IC device 200 is connected to carrier 100, a reflow process may be performed to join interconnects 112 to electrical contacts 204 of IC device 200 and contacts 112 upon surface 102 of carrier 100. When IC device 200 is connected to carrier 100, an electrical or current path is formed from a path 202 within IC device 200 to a path 101 within carrier 101.

Cover 252 may be connected to IC device 200 by thermal interface material (TIM) 205 that may be applied upon the top surface of IC device 200 or upon the underside of cover 252. Cover 252 may be connected to carrier 100 by adhesive or seal band material. Cover 252 may have a polygonal normal shape and may be the same polygonal shape as carrier 100.

Connector 150 may be connected to carrier 100 by solder interconnects, pin and hole interconnects, or the like. When connector 150 is connected to carrier 100 its conductive interconnects become electrically connected to a contact 112 or to a path 101 of carrier 100.

Package 250 may be formed upon when the IC device 200 is connected to carrier 100, cover 252 is connected to IC device 200 and to carrier 100, and a desired number of connectors 150 are connected to carrier 150.

Figure 4:
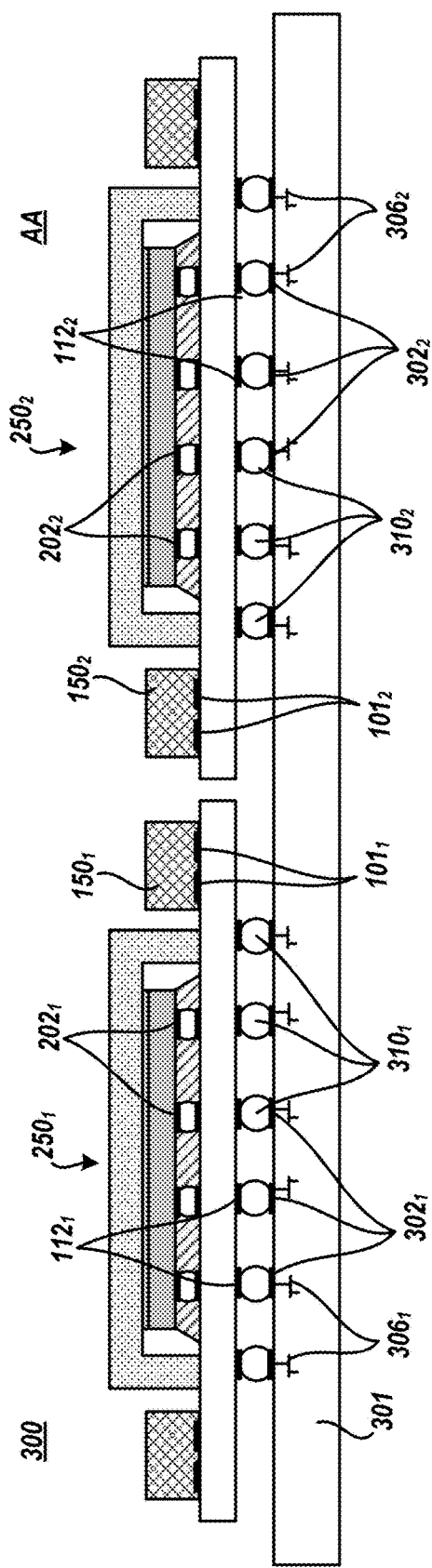
FIG. 4 depicts a cross section view of an electronic system at a particular fabrication stage, according to one or more embodiments of the present invention.

FIG. 4 depicts a cross section view of an electronic system 300 at a particular fabrication stage, according to one or more embodiments of the present invention. At the present fabrication stage, a plurality of packages 250 are connected to a system board 301.

System board 301 may be the main system or mother board of system 300. System board 301 may be fabricated as an organic system board, as is known in the art. System board 301 provides mechanical support for numerous IC packages 250. Board 301 may further provide mechanical support for other computing devices such as hard drives, memory modules, and may include connectors so that peripheral devices may connect there to, or the like. System board 301 includes electrical paths 306 there within. For example, package $250_1$ may include electrical paths $306_1$. Each electrical path 306 may be connected to a contact 302 on the upper surface of system board 301. The electrical path 306 may be connected to the other computing devices such as hard drive, memory module, communication interface, or the like.

Package 250 may be connected to system board 301 by interconnects 310. Interconnects 310 are conductive and connect contacts 112 on the lower surface 104 of carrier 100 to system board 301 contact 302 and may be a wire bond, solder bond, stud, conductive ball, conductive button, land grid array (LGA) of complaint pins, and the like. Interconnects 310 may be larger and thus more robust than interconnects 210. When package 250 is connected to system board 301, a second reflow process may be performed to join interconnects 310 to electrical contacts 112 on surface 104 of carrier 100 to contacts 302 of system board 301. Alternately, a mechanical pressurized interconnect via an intervening socket may be established.

Figure 5:
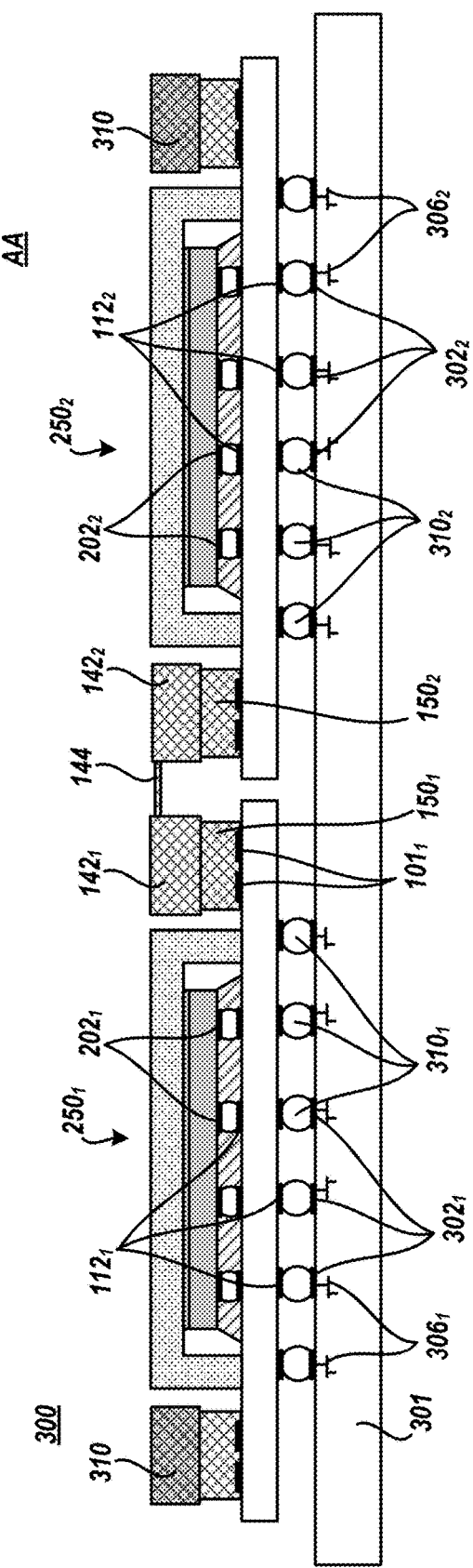
FIG. 5 depicts a cross section view of an electronic system at a particular fabrication stage, according to one or more embodiments of the present invention.

FIG. 5 depicts a cross section view of electronic system 300 at a particular fabrication stage, according to one or more embodiments of the present invention. At the present fabrication stage, a connector $142_1$ is seated to connector $150_1$ and connector $142_2$ is seated to connector $150_2$. When connector 142 is seated to connector 140 the top surface of connector 142 may be coplanar with the top surface of cover 252. This way, a planar bottom surface of a heatsink 340, exemplarily shown in FIG. 7, may contact both cover 252 and connector 140 to promote the transfer of heat away from package 250.

When the connector $142_1$ is seated upon the connector $150_1$ and when the connector $142_2$ is seated upon the connector $150_2$, electrical paths within the PP connector 140 exist between paths 101 of the first carrier 100 and paths 101 of the second carrier 100.

In one type of I/O, data may be sent from an electrical path $202_1$ within IC device $200_1$ to an electrical path $306_1$ of system board 302 by way of an electrical path $101_1$ through carrier $100_1$.

In another type of I/O, data may be sent from an electrical path $202_1$ within IC device $200_1$ to an electrical path $202_2$ within IC device $200_2$ by way of an electrical path $101_1$ through carrier $100_1$ by way of an electrical path through PP connector and by way of an electrical path $101_2$ through carrier $100_2$. Such data may then be subsequently routed from an electrical path $202_2$ within IC device $200_2$ to an electrical path $306_2$ of system board 302 by way of an electrical path $101_2$ through carrier $100_2$.

In another type of I/O, data may be sent from an electrical path $202_1$ within IC device $200_1$ to an electrical path $306_2$ of system board 302 by way of an electrical path $101_1$ through carrier $100_1$ by way of an electrical path through PP connector 140 and by way of an electrical path $101_2$ through carrier $100_2$.

As such, with the addition of PP connector 140, IC device $200_1$ has a relatively increased number of I/O routes to a second IC device $200_2$ and/or to system board 301. As such, the number of I/O routes may be maintained or may increase even though the normal size of IC device 200 may be smaller than traditional IC devices.

In some embodiments, it may be desired that a package 250 not be connected with a neighboring package 250 by a PP connector 140. In these implementations, connector 150 need not be connected to carrier 100 nearest to the neighboring package 250. Alternatively, a filler 310 may be connected to connector 150. Filler 310 does not have any electrical paths therein and may be a similar or same form factor as compared to connector 142. Filler 310 may provide mechanical support between heatsink 340 and the carrier 100 to which it is connected.

Figure 6:
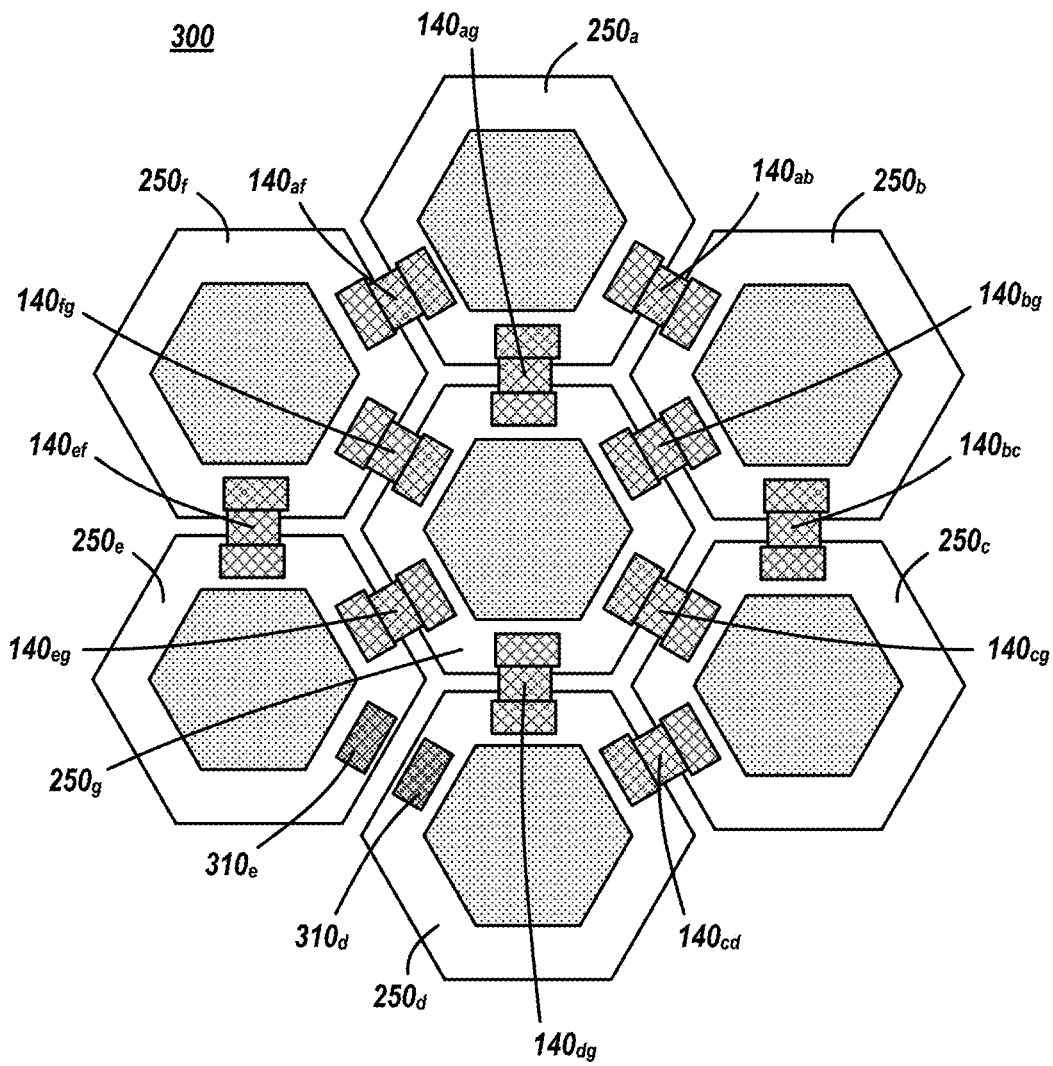
FIG. 6 depicts a normal view of an electronic system at a particular fabrication stage, according to one or more embodiments of the present invention.

FIG. 6 depicts a normal view of electronic system 300 at a particular fabrication stage, according to one or more embodiments of the present invention. The depicted fabrication stage may be the same fabrication stage as that depicted in FIG. 5. Numerous packages 250 may be connected to system board 301. For example, a central package 250g is connected to system board 301 and one or more outer packages 250a-250g may be connected to system board 301 about the perimeter of central package 250g. As depicted a side surface of the first package 250 may be parallel with a corresponding side surface of the neighboring second package 250. Neighboring packages 250 may be connected by a PP connector 140. For example, package 250a may be connected to package 250b by PP connected 140ab, package 250d may be connected to package 250e by PP connected 140de, package 250f may be connected to package 250g by PP connected 140fg, and the like. In the depicted embodiment, the central package 250g may conduct the various types of I/O to system board 301 through its own carrier 100, through its neighboring and interconnected carrier 100 (e.g. carrier 100d, or the like), or through its neighboring and interconnected carrier 100 by way of that carrier's IC device 200.

In some embodiments, it may be desired that a package 250d not be connected with a neighboring package 250e by a PP connector 140. In these implementations, a filler 310d may be connected to connector 150d and a filler 310e may be connected to connected 150e.

Figure 7:
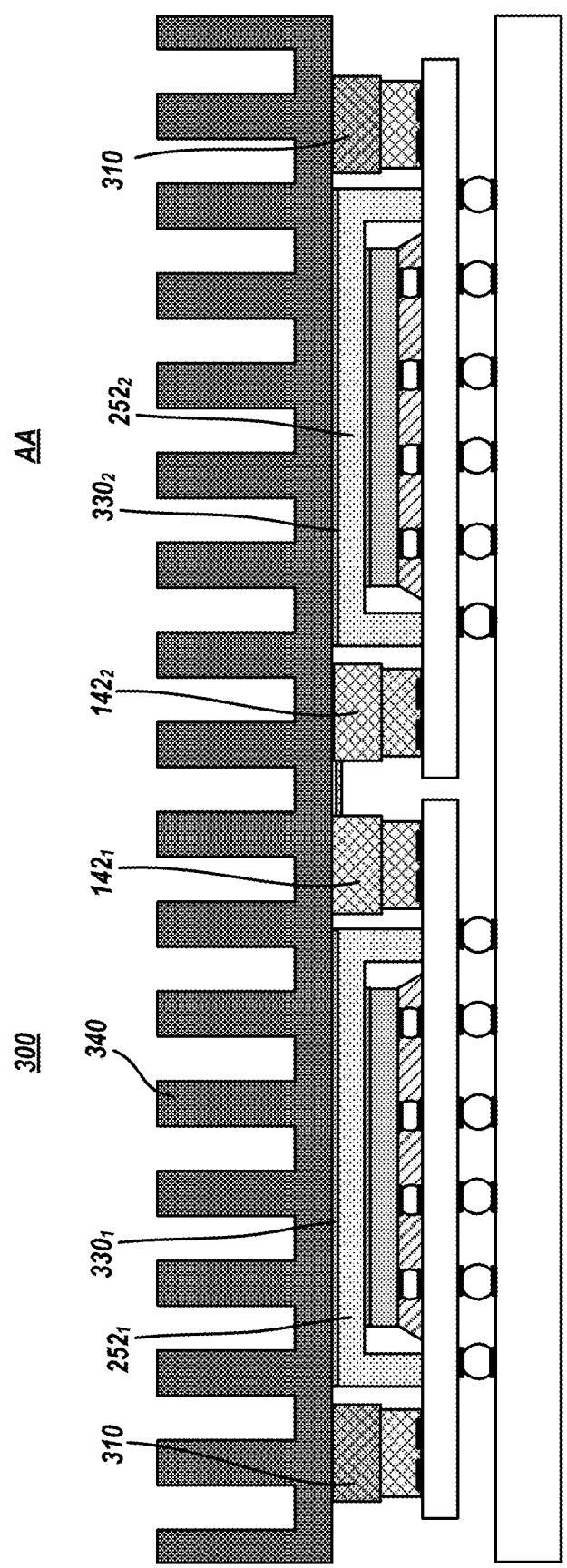
FIG. 7 depicts a cross section view of an electronic system at a particular fabrication stage, according to one or more embodiments of the present invention.

FIG. 7 depicts a cross section view of electronic system 300 at a particular fabrication stage, according to one or more embodiments of the present invention. At the depicted fabrication stage, heat sink 340 is connected to the top surface of the numerous covers 252 and to the top surface of connectors 142.

To assist in the removal of heat from IC device 200, heat sink 340 may be joined to each package 250 of device 300. The heat sink 340 may be connected one or more of the various covers 250 via thermal interface material 330 that may be applied to the top surface of covers 252 and or to the underside of heat sink 340. Heat sink 304 may be a passive heat exchanger that cools IC devices 200 by dissipating heat into the surrounding air. Heat sink 304 may be an active heat exchanger that cools IC devices 200 by dissipating heat into an actively cooled fluid or another actively cooled structure. In an implementation, a single heat sink 340 is connected to one package 250. In another implementation, a single heat sink 340 is connected to multiple packages 250. In another implantation, a single heat sink 340 is connected to all of the packages 250 of system 300.

During operation of electronic device 300, a thermal path may exist from IC device 200 to heat sink 340 through TIM 205, to cover 252, through TIM 330, and into heat sink 340. Heat sink 340 may be connected to system board 301 via one or more connection devices, frames, or the like.

Figure 8:
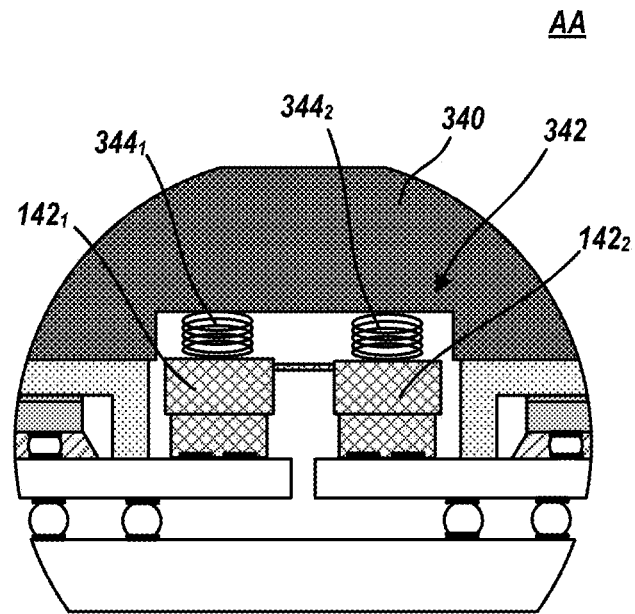
FIG. 8 depicts a detail cross section view of an electronic system, according to one or more embodiments of the present invention.

FIG. 8 depicts a detail cross section view of electronic system 300, according to one or more embodiments of the present invention. In an implementation, heat sink 340 may include an underside recess 342 in locations above the PP connectors 140. Within the recess 342 there may be one or more springs 344. Under no compression, springs 344 may extend beyond the bottom surface of heat sink 340. Under compression, when heat sink is connected to packages 250, springs 344 may exert a predetermined force upon the top surface of connectors 142 of the PP connector 140.

Figure 9A:
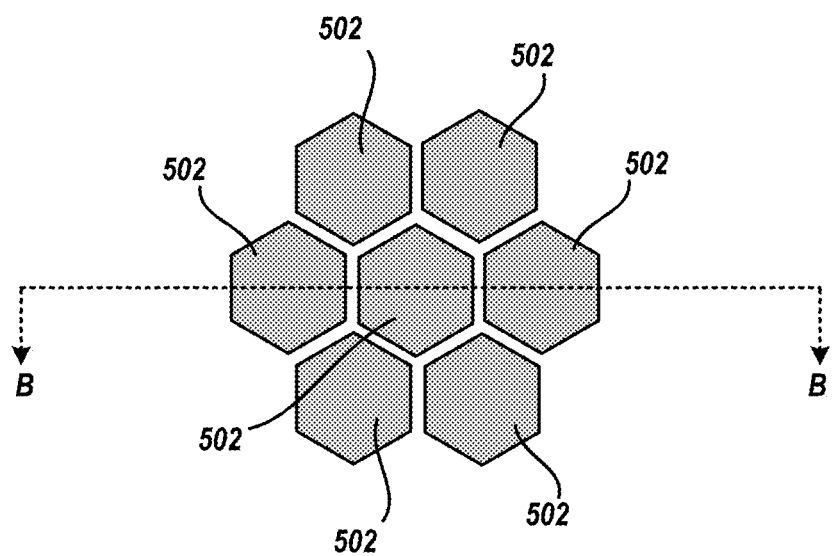
FIG. 9A depicts a normal view of numerous IC devices, according to one or more embodiments of the present invention.

FIG. 9A depicts a normal view of numerous IC devices 502, according to one or more embodiments of the present invention. IC device 502 may be an IC chip, die, processor, microchip, field programmable gate array, or other type of data processing or storage device, that is configured to be connected a carrier 400, exemplarily shown in FIG. 10, along with one or more other of the same type of IC devices 502. IC devices 502 may have a polygonal normal shape.

In an implementation, there may be a central IC device 502 and one or more perimeter IC devices 502 arranged about the perimeter of the central IC devices 502. As depicted a side surface of the central IC device 502 may be parallel with a corresponding side surface of the neighboring permitted IC device 502. Neighboring IC devices 502 may be connected by a chip to chip (CC) bridge 550, as is exemplarily shown in FIG. 11.

Figure 9B:
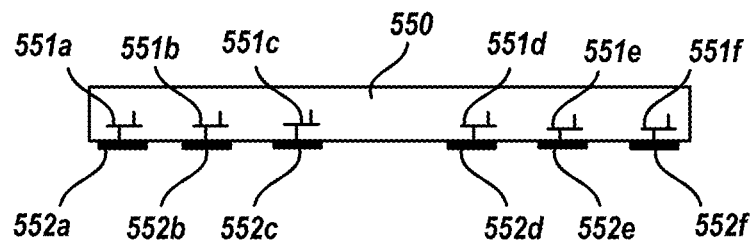
FIG. 9B depicts a cross section view of a chip to chip bridge, according to one or more embodiments of the present invention.

FIG. 9B depicts a cross section view of CC bridge 550, according to one or more embodiments of the present invention. CC bridge 550 may be a glass, substrate, laminate, organic material (e.g., Silicon, etc.) based structure that includes electrically insulating or dielectric material that surrounds electrical paths 551 therein. CC bridge 550 may include a single or multiple electrical path levels. CC bridge 550 includes an IC device facing surface that may include contacts 552. Contacts 552 are associated with I/O between two different IC devices 502 and may be connected to electrical paths 551. For example, a path 551a may connect a contact 552a associated with a first IC device 502 with a contact 552d associated with a second IC device 502, a path 551b may connect a contact 552b associated with the first IC device 502 with a contact 552e associated with the second IC device 502, a path 551c may connect a contact 552c associated with the first IC device 502 with a contact 552e associated with the second IC device, and the like. Contact 552 is electrically conductive and may be a pad, pin, receptacle, socket, or the like.

Figure 10:
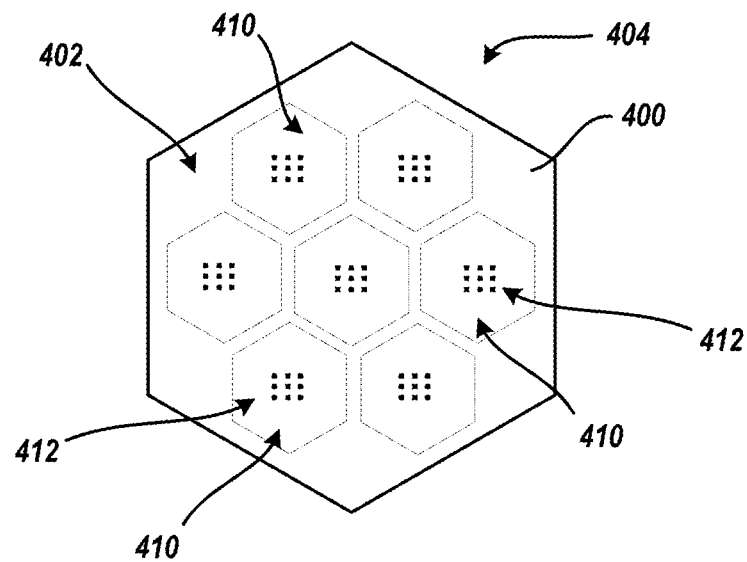
FIG. 10 depicts a normal view of an IC device carrier, according to one or more embodiments of the present invention.

FIG. 10 depicts a normal view of an IC device carrier 400, according to one or more embodiments of the present invention. Carrier 400 has a polygonal normal shape and may be an organic carrier. For example, carrier 400 may have a hexagonal normal shape as depicted. Carrier 400 provides mechanical support for multiple IC devices 502 and includes electrical paths there within. For example, carrier 400 may include electrical paths 401, exemplary shown in FIG. 13, there within.

Carrier 400 includes multiple IC device regions 410. IC device region 410 may be a footprint of one IC device which is supported by carrier 100 and may extend from a top surface 402 of carrier 400 to the bottom surface 404 of carrier 400. The surface area of region 410 may be relatively larger upon surface 404 relative to that upon surface 402. IC device region 410 includes contacts 412 upon surface 402 and includes contacts 412 upon surface 404.

Contacts 412 within region 410 are associated with I/O between that associated IC device and a higher level system or mother board. As such, within region 410, a path 401 may connect a contact 412 upon surface 402 with a contact 412 upon surface 404. Contact 112 is electrically conductive and may be a pad, pin, receptacle, socket, or the like.

FIG. 11 depicts a cross section view of an IC package 600 at a particular fabrication stage, according to one or more embodiments of the present invention. At the present fabrication stage, CC bridge 550 is connected to neighboring IC devices 502.

CC bridge 550 may be connected to neighboring IC device 502 by interconnects 510. For example, CC bridge $550_1$ may be connected to IC device $502_1$ and to IC device $502_2$ by interconnects $510_1$, CC bridge $550_2$ may be connected to IC device $502_2$ and IC device $502_3$ by interconnects $510_2$. An interconnect 510 is conductive and is configured to electrically connect a contact 506 of IC device 550 with a contact 552 of CC bridge 550. For example, an interconnect $510_1$ connects a contact $506_1$ of IC device $550_1$ or a contact $506_2$ of IC device $550_2$ with a contact $552_1$ of CC bridge $550_1$, an interconnect $510_2$ connects a contact $506_2$ of IC device $550_2$ or a contact $506_3$ of IC device $550_3$ with a contact $552_2$ of CC bridge $550_2$. Interconnect 510 is generally smaller in size, volume, or the like, relative to connector 610, that connects the neighboring IC devices 502 to the carrier 400, exemplarily shown in FIG. 6, and may be a miro-wire, miro-solder, miro-stud, miro-ball, or the like. A reflow process may be performed to join interconnects 510 to electrical contacts 506 of the neighboring IC devices 502 with contacts 552 of CC bridge 550.

When CC bridge 550 is connected to the neighboring IC devices 502, one or more electrical or current paths are formed from paths within the first IC device 502 to paths within the first IC device 502 through CC bridge 550. For example, an electrical or current path is formed from path $508_1$ within IC device $502_1$ to path $508_2$ within IC device $502_2$ through CC bridge $550_1$, an electrical or current path is formed from path $508_3$ within IC device $502_2$ to path $508_4$ within IC device $502_3$ through CC bridge $550_2$.

FIG. 12 depicts a cross section view of IC package 600 at a particular fabrication stage, according to one or more embodiments of the present invention. At the depicted fabrication stage, interconnects 610 are formed upon the IC devices 502. For example, an interconnect $610_1$ is placed upon each contact $504_1$ of IC device $502_1$, an interconnect $610_2$ is placed upon each contact $504_2$ of IC device $502_2$, an interconnect $610_3$ is placed upon each contact $504_3$ of IC device $502_3$.

Interconnect 610 is conductive and is configured to electrically connect a contact 504 of IC device 502 with a contact 412 on the upper surface 402 of carrier 400. Interconnect 210 may be a wire, solder, stud, conductive ball, conductive button, socket, receptacle, or the like.

FIG. 13 depicts a cross section view of IC package 600 at a particular fabrication stage, according to one or more embodiments of the present invention. At the current fabrication stage, IC device carrier 400 is connected to the IC devices 502.

The IC devices 502 may be connected to carrier 400 by interconnects 610. The IC devices 502 may be further connected to carrier 400 by underfill 211. Underfill 211 may be electrically-insulating, may substantially surround interconnects 610, may isolate individual interconnects 610, and may provide mechanical support between the IC devices 502 and carrier 400. Underfill 211 may also prevent damage to individual interconnects 610 due to thermal expansion mismatches between the IC devices 502 and carrier 400. Underfill 211 may further substantially surround interconnects 510, may isolate individual interconnects 510, and may provide mechanical support around and surrounding CC bridge 550. When carrier 400 is connected to the IC devices 502, the CC bridge 550 is generally positioned between the top surface 402 of carrier 400 and the bottom surface of the IC devices 502.

When the IC devices 502 are connected to carrier 400, a reflow process may be performed to join interconnects 610 to electrical contacts 504 of the IC device 502 and contacts 412 upon surface 402 of carrier 400.

Figure 15:
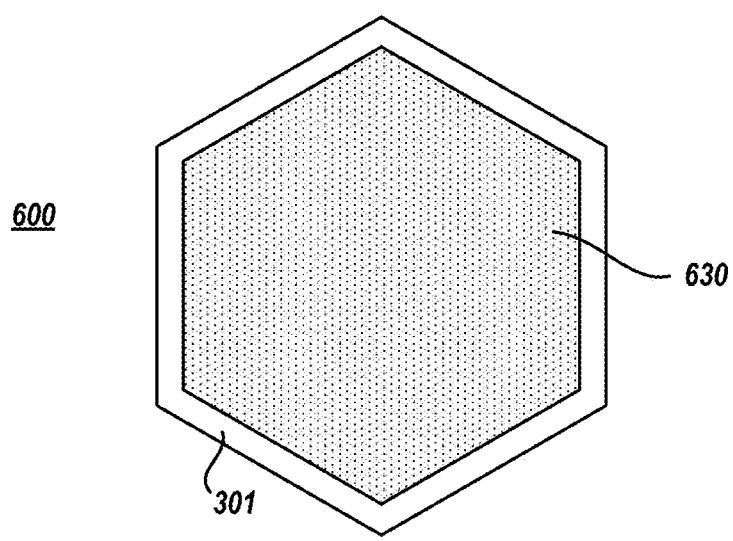
FIG. 15 depicts a normal view of an IC package at a particular fabrication stage, according to one or more embodiments of the present invention.

Cover 630 may be connected to one or more of the IC devices 502 by TIM 205 that may be applied upon the top surface of each IC device 502 or upon the underside of cover 630. Cover 630 may be connected to carrier 400 by adhesive or seal band material. Cover 630 may have a polygonal normal shape and may be the same polygonal shape as carrier 400, as depicted in FIG. 15.

When IC device 502 is connected to carrier 400, an electrical or current path is formed from a path 508 within IC device 502 to a path 401 within carrier 101. For example, an interconnect 610 electrically connects an electrical path 508a within IC device $502_1$ with an electrical path 401a in carrier 400, an interconnect 610 electrically connects an electrical path 508b within IC device $502_2$ with an electrical path 401b in carrier 400, an interconnect 610 electrically connects an electrical path 508c within IC device $502_3$ with an electrical path 401c in carrier 400. These electrical paths may be associated with I/O between the associated IC device 502 and the higher level system board 301 through carrier 400.

When IC device 502 is connected to carrier 400, an electrical or current path is formed from a path 508 within the first IC device 502 to a path 508 within the second neighboring IC device 502 through CC bridge 550. For example, CC bridge $550_1$ electrically connects an electrical path $508_1$ within IC device $502_1$ with an electrical path $508_2$ within IC device $502_2$ and CC bridge $550_2$ electrically connects an electrical path $508_3$ within IC device $502_1$ with an electrical path $508_4$ within IC device $502_3$. These electrical paths may be associated with I/O between neighboring IC devices 502. These electrical paths may further allow for indirect I/O between the first IC device 502 and the higher level system board 301 through carrier 400 by way of the neighboring second IC device 502 and CC bridge 550. For example, an output may be generated within IC device $502_3$ and initially associated with path 508c there within to be outputted to the system board 301 through carrier 400. Due to a failure, a fault, congestion, or the like, associated with the initially arbitrated path 508c, that output may be routed to path $508_4$ through CC bridge $550_2$, to path $508_3$ within the neighboring IC device $502_2$. In turn, IC device $502_2$ may route that output from path $508_3$ to path 508b where the output may pass through contact 610 into carrier 400 and ultimately to system board 301.

As such, with the addition of CC bridge 550, the first IC device 502 has a relatively increased number of I/O routes to a second IC device 502 and/or to system board 301. As such, the number of I/O routes may be maintained or may increase even though the normal size of IC device 502 may be smaller than traditional IC devices.

Figure 14:
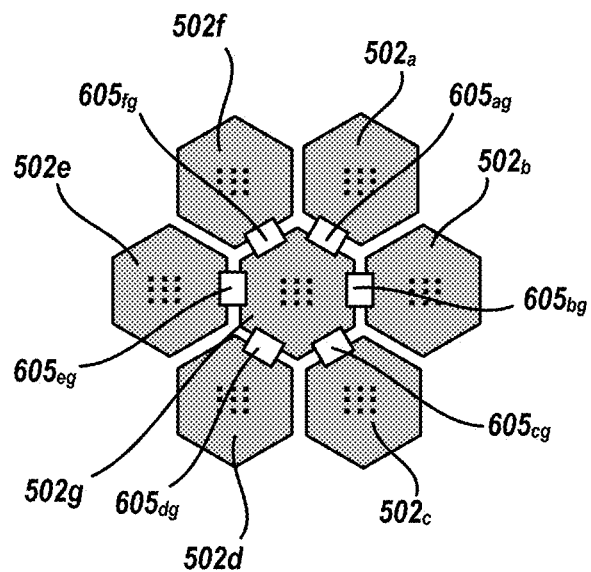
FIG. 14 depicts a normal view of an IC package at a particular fabrication stage, according to one or more embodiments of the present invention.

FIG. 14 depicts a normal view of IC package at a particular fabrication stage, according to one or more embodiments of the present invention. FIG. 14 depicts the similar fabrication stage depicted in FIG. 11. In the depicted implementation, there may be a central IC device 502g and perimeter IC devices 502a-502f arranged about the perimeter of the central IC device 502g. A CC bridge $550_{ag}$ may connect IC device 502a with IC device 502g, a CC bridge $550_{bg}$ may connect IC device 502b with IC device 502g, CC bridge $550_{cg}$ may connect IC device 502c with IC device 502g, CC bridge $550_{dg}$ may connect IC device 502d with IC device 502g, CC bridge $550_{eg}$ may connect IC device 502e with IC device 502g, and CC bridge $550_{fg}$ may connect IC device 502f with IC device 502g. Further, neighboring IC devices 502 need not be directly connected by a CC bridge 550. For example, IC device 502c is not directly electrically connected by a CC bridge 550 to neighboring IC device 502d. Through one implementation is shown, other implementations where all or some neighboring IC devices are directly interconnected by respective CC bridges 500 are contemplated.

Figure 16:
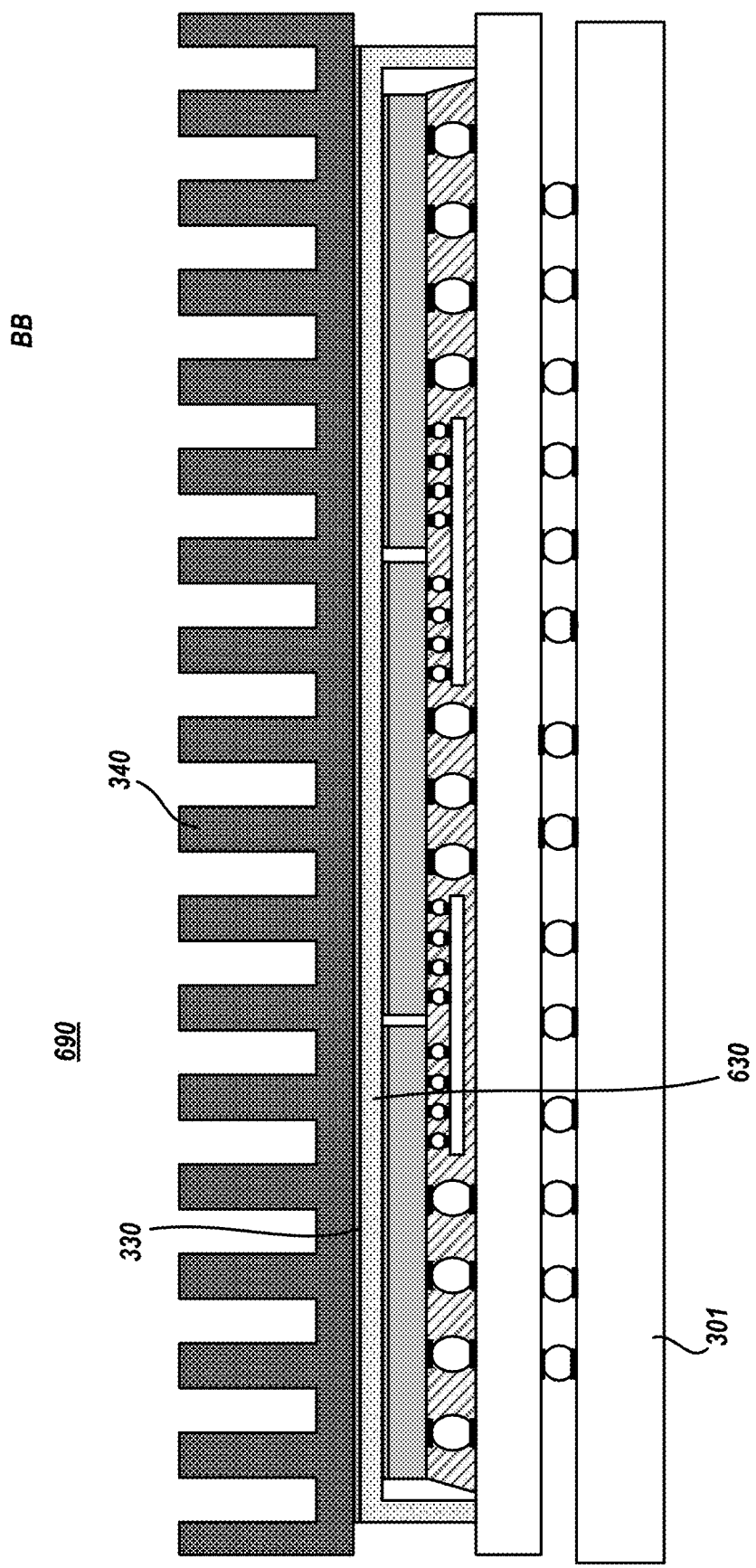
FIG. 16 depicts a detail cross section view of an electronic system at a particular fabrication stage, according to one or more embodiments of the present invention.

FIG. 16 depicts a detail cross section view of an electronic system 690 at a particular fabrication stage, according to one or more embodiments of the present invention. At the depicted fabrication stage, heat sink 340 is connected to the top surface of the cover 630.

To assist in the removal of heat from the IC devices 502, heat sink 340 may be joined to the cover 630. The heat sink 340 may be connected the cover 630 via TIM 330 that may be applied to the top surface of cover 630 and or to the underside of heat sink 340. Heat sink 304 may be a passive heat exchanger that cools the IC devices 502 by dissipating heat into the surrounding air. Heat sink 304 may be an active heat exchanger that cools IC devices 502 by dissipating heat into an actively cooled fluid or another actively cooled structure. The normal shape of heatsink 340 may be the same underlying normal shape as cover 630.

TIM 205 and/or TIM 330 may be a thermal grease, thermal gel, or the like, and may be dispensed, formed, applied, etc. upon an indicated surface in a predetermined pattern (e.g. star pattern, or the like) so as to substantially cover the surface area of the upper surface of the IC device, upper surface of the cover, respectively.

During operation of electronic device 690, a thermal path may exist from each IC device 502 to heat sink 340 through TIM 205, to cover 630, through TIM 330, and into heat sink 340. Heat sink 340 may be connected to system board 301 via one or more connection devices, frames, or the like.

Figure 17:
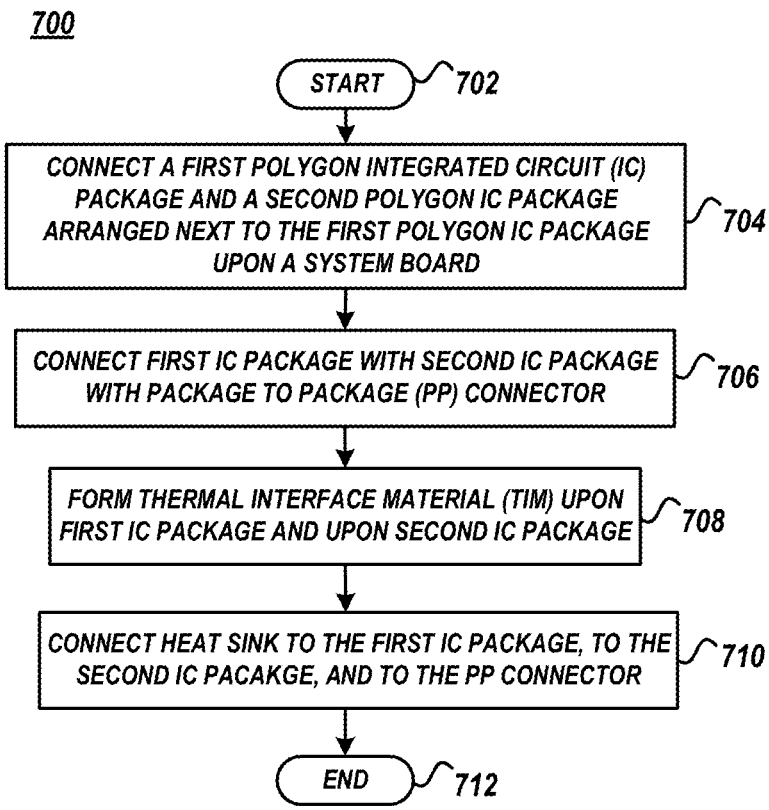
FIG. 17 depicts an electronic system fabrication method, according to one or more embodiments of the present invention.

FIG. 17 depicts an electronic system fabrication method 700, according to one or more embodiments of the present invention. Method 700 may be utilized to fabricate electronic system 300. Method 700 begins at block 702 and continues with connecting a first polygon IC package and a second polygon IC package to a system board such that the second polygon IC package is arranged next to or neighboring the first polygon IC package (block 704). For example, first polygon IC package $250_1$ is connected to system board $301_1$ by interconnects 310 connecting contacts $112_1$ of package $250_1$ with contacts $302_1$ of system board 301 and a neighboring second polygon IC package $250_2$ is connected to system board 301 by interconnects $310_2$ connecting contacts $112_2$ of package $250_2$ with contacts $302_2$ of system board 301.

Method 700 may continue with connecting the first polygon IC package and the second polygon IC package with a PP connector. For example, the first polygon IC package $250_1$ is connected to the neighboring second polygon IC package $250_2$ by seating connector $142_1$ of PP connector 140 into connector $150_1$ of the first polygon IC package $250_1$ and by seating connector $142_2$ of PP connector 140 into connector $150_2$ of the second polygon IC package $250_2$.

Method 700 may continue with forming TIM upon the first polygon IC package and upon the second polygon IC package (block 708). For example, TIM 205 is formed upon the top surface of cover $252_1$ of the first IC package $250_1$ and TIM 205 is formed upon the top surface of cover $252_2$ of the first IC package $250_2$ TIM 205 may alternatively be formed upon regions of the bottom surface of heat sink 340 that are aligned with the top surface of cover $252_1$ and the top surface of cover $252_2$. The TIM 205 may be applied in a predetermined pattern such that the entire top surface of cover $252_1$ and the top surface of cover $252_2$ has TIM 205 formed thereupon when heat sink 340 is compressed thereupon.

Method 700 may continue with connecting the heat sink to the first polygon IC package, to the second polygon IC package, and to the PP connector. For example, heat sink 340 may be connected to the first IC package $250_1$ by the lower surface of heatsink 340 contacting the TIM 250 on the top surface of cover $252_1$ and may be connected to the second IC package $250_2$ by the lower surface of heatsink 340 contacting the TIM 250 on the top surface of cover $252_2$. Heat sink 340 may be connected to PP connector 140 by the lower surface of heat sink 340 contacting the top surface of connector $142_1$ and the top surface of connector $142_2$. Method 700 may end at block 712.

Figure 18:
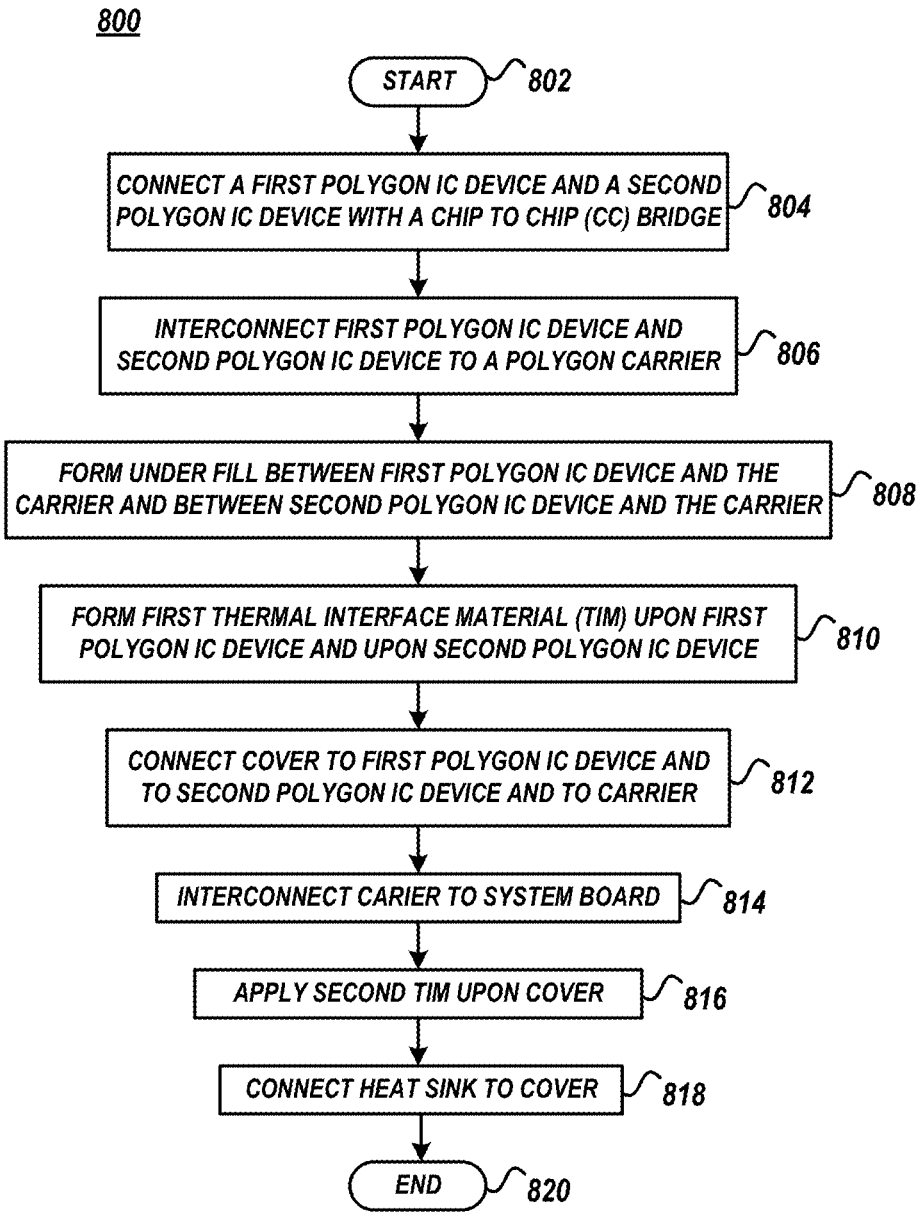
FIG. 18 depicts an electronic system fabrication method, according to one or more embodiments of the present invention.

FIG. 18 depicts an electronic system fabrication method 800, according to one or more embodiments of the present invention. Method 800 may be utilized to fabricate electronic system 690. Method 800 begins at block 802 and may continue with connecting a first polygon IC device and a second polygon IC device to chip to chip (CC) bridge such that the second polygon IC device is arranged next to or neighboring the first polygon IC device (block 804). For example, first polygon IC device $502_1$ is connected to second polygon IC device $502_2$ by CC bridge 550. CC bridge 550 may be connected to IC device $502_1$ by interconnects $510_1$ connecting contacts $552_1$ of CC bridge 550 with contacts $506_1$ of IC device $502_1$. CC bridge 550 may be connected to IC device $502_2$ by interconnects $510_2$ connecting contacts $552_2$ of CC bridge 550 with contacts $506_2$ of IC device $502_2$.

Method 800 may continue with connecting the first polygon IC device and the second polygon IC device to a polygon IC device carrier (block 806). For example, first polygon IC device $502_1$ and second polygon IC device $502_2$ are connected to IC device carrier 400 by interconnects 610. First polygon IC device $502_1$ may be connected to IC device carrier 400 by interconnects $610_1$ connecting contacts $504_1$ of IC device $502_1$ with contacts $412_1$ of carrier 400. Second polygon IC device $502_2$ may be connected to IC device carrier 400 by interconnects $610_2$ connecting contacts $504_2$ of IC device $502_2$ with contacts $412_2$ of carrier 400. When the first polygon IC device and the second polygon IC device are connected to the polygon IC device carrier, the CC bridge connecting the first polygon IC device and the second polygon IC is generally between the respective lower surfaces of the first polygon IC device and the second polygon IC and the top surface of the polygon carrier.

Method 800 may continue with forming underfill between the first polygon IC device and the second polygon IC device and the polygon IC device carrier surrounding the CC bridge. For example, the IC devices 502 may be connected to carrier 400 by underfill 211. Underfill 211 may be electrically-insulating, may substantially surround interconnects 610, may isolate individual interconnects 610, and may provide mechanical support between the IC devices 502 and carrier 400. Underfill 211 may further substantially surround interconnects 510, may isolate individual interconnects 510, and may provide mechanical support around and surrounding CC bridge 550.

Method 800 may continue with forming a first TIM upon the first polygon IC device and upon the second polygon IC device (block 810). For example, TIM 205 may be applied upon the top surface of each IC device 502 or upon the underside of cover 630. The TIM 205 may be applied in a predetermined pattern such that the entire top surface of each IC device 502 is covered by TIM 205 upon when the cover 630 is connected thereto.

Method 800 may continue with connecting a cover to the first polygon IC device, to the second polygon IC device, and to the carrier (block 812). For example, cover 630 may be connected to the first IC device $502_1$ by the lower inner surface of cover 630 contacting the top surface of first IC device $502_1$ via the TIM $205_1$ and may be connected to the second IC device $502_2$ by the lower inner surface of cover 630 contacting the top surface of second IC device $502_2$ via the TIM $205_2$. Cover 630 may be connected to the carrier 400 by the lower perimeter surface of cover 630 contacting carrier 400 via an adhesive, seal band, or the like.

Method 800 may continue with applying a second TIM upon the top surface of the cover (block 816). For example, TIM 330 may be applied to the top surface of cover 630 and or to the underside of heat sink 340. Method 800 may continue with connecting a heat sink to the cover (block 818). For example, heat sink 340 may be connected to the cover 630 by the lower surface of heatsink 340 contacting the TIM 330 on the top surface of cover 630. Method 800 may end at block 820.

Figure 19:
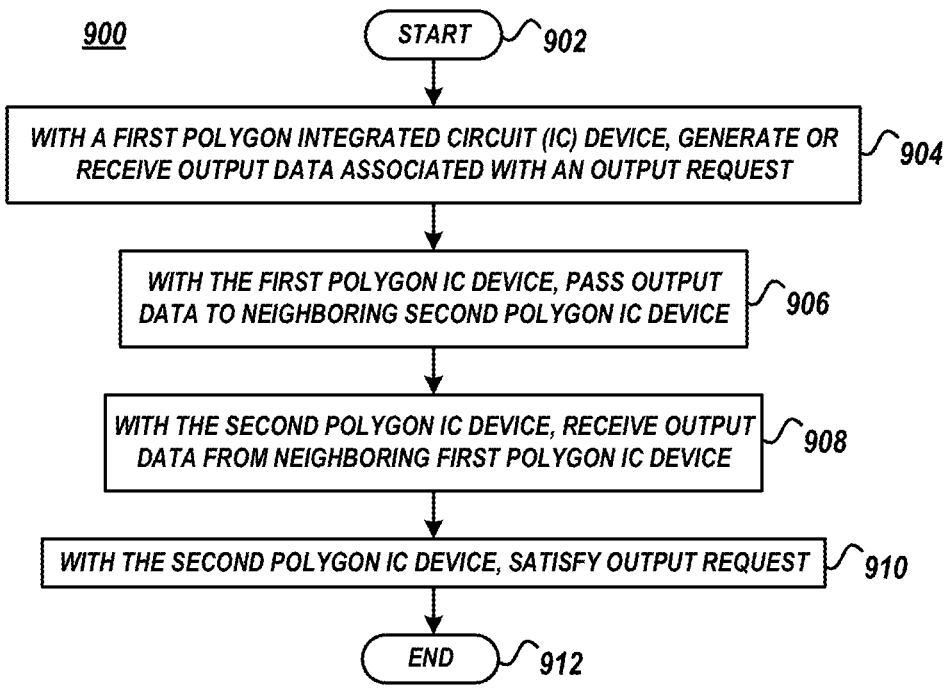
FIG. 19 depicts a multiple IC device system data input method, according to one or more embodiments of the present invention.

FIG. 19 depicts a multiple IC device system data input method 900, according to one or more embodiments of the present invention. Method 900 may be performed, for example, by electronic system 300 or electronic system 690. Method 900 begins at block 902 and may continue with a first polygon IC device generating, receiving, etc., output data associated with an output request. For example, IC package $250_1$ or IC device $502_1$ may generate the output request and associated output data that is to be sent through system board 301 to a destination data handling device. The destination data handling device may be connected to system board 301 or communicatively connected to system board 301.

Method 900 may continue with the first polygon IC device passing the output data to a neighboring second polygon IC device (block 906). For example, IC package 250₁ or IC device 502₁ may determine that itself cannot satisfy the output request by directly passing the output data to the system board 301. As such, IC package 250₁ may send or pass the output data to the neighboring IC package 250₂ through PP connector 140. Similarly, IC device 502₁ may send or pass the output data to the neighboring IC device 502₂ through CC bridge 550.

Method 900 may continue with the second polygon IC device receiving the output data from the first polygon IC device (block 908). For example, IC package 250₂ may receive the output data from the neighboring IC package 250₁ from PP connector 140. Similarly, IC device 502₂ may receive the output data from the neighboring IC device 502₁ from the CC bridge 550.

Method 900 may continue with the second polygon IC device satisfying the output request. For example, the IC package 250₂ may pass the output data directly from the IC package 250₂ to the system board 301 through its associated carrier 100₂ where, in turn, the system board 301 may pass the data to the destination device. Similarly, the IC device 502₂ may pass the output data directly from the IC device 502₂ to the system board 301 through carrier 400 where, in turn, the system board 301 may pass the data to the destination device. Method 900 may end at block 912.

Figure 20:
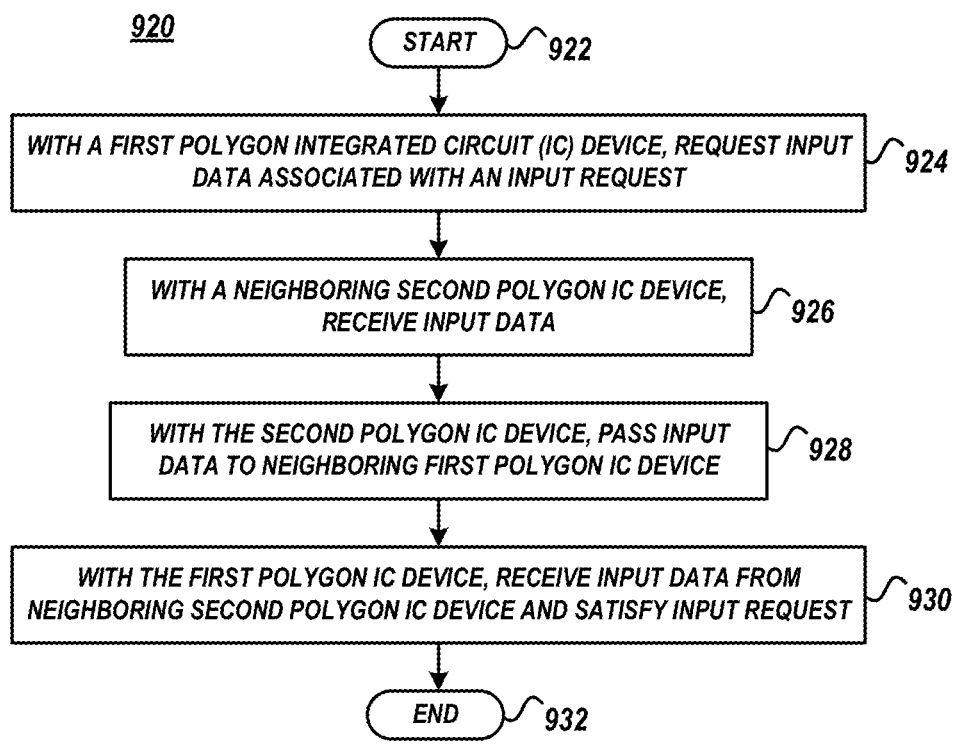
FIG. 20 depicts a multiple IC device system data output method, according to one or more embodiments of the present invention.

FIG. 20 depicts a multiple IC device system data output method 920, according to one or more embodiments of the present invention. Method 920 may be performed, for example, by electronic system 300 or electronic system 690. Method 920 begins at block 922 and may continue with a first polygon IC device requesting input data associated with an input request (block 924). For example, IC package 250₁ or IC device 502₁ may receive or generate the input request and request the input data from an external data handling device that will be received though system board 301. This external data handling device may be connected or communicatively connected to the system board 301.

Method 920 may continue with a neighboring second polygon IC device receiving the input data (block 926). For example, IC package 250₁ or IC device 502₁ may determine that itself cannot directly receive the input data from the system board 301. As such, IC package 250₂ or IC device 502₂ may directly receive the input data from system board 301.

Method 920 may continue with the second polygon IC device passing the input data to the neighboring first polygon IC device (block 928). For example, IC package 250₂ may send or pass the input data to the neighboring IC package 250₁ through PP connector 140. Similarly, IC device 502₂ may send or pass the input data to the neighboring IC device 502₁ through CC bridge 550.

Method 920 may continue with the first polygon IC device satisfying the input request (block 930). For example, if an another data handling device made the input request, the IC package 250₁ or the IC device 502₁ may send the input data to the other data handling device to satisfy the input request. Similarly, if the first polygon IC device itself made the input request, the IC package 250₁ or the IC device 502₁ may satisfy its own input request upon receipt of the input data from the IC package 250₂ or the IC device 502₂, respectively. Method 920 may end at block 932.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 100, 400, etc., regardless of the actual spatial orientation of the carrier 100, 400. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:
1. An electronic system comprising:
   a first integrated circuit (IC) device package comprising: a first carrier, a first IC device connected to a top surface of the first carrier (first carrier top surface), a first cover connected to the first IC device and connected to the first carrier top surface, a first carrier connector connected to the first carrier top surface;
   a second IC device package comprising: a second carrier, a second IC device connected to a top surface of the second carrier (second carrier top surface), a second cover connected to the second IC device and connected to the second carrier top surface, a second carrier connector connected to the second carrier top surface;
   a package to package (PP) connector comprising: cabling connected to a first cabling connector and to a second cabling connector, the first cabling connector seated to the first carrier connector and the second cabling connector seated to the second carrier connector, wherein a major planar top surface of the first cabling connector is coplanar with a top surface of the first cover and wherein a major planar top surface of the second cabling connector is coplanar with a top surface of the second cover; and
   a first heatsink connected to the top surface of the first cover and to the major planar top surface of the first cabling connector.

2. The electronic system of claim 1, wherein the first heatsink is further connected to the top surface of the second cover and to the major planar top surface of the second cabling connector.

3. The electronic system of claim 1, further comprising:
a second heatsink connected to the top surface of the second cover and to the major planar top surface of the second cabling connector.

4. The electronic system of claim 1, further comprising a spring between the first heatsink and the major planar top surface of the first cabling connector.

5. The electronic system of claim 1, wherein the first integrated IC device package further comprises:
a second carrier connector connected to the first carrier top surface.

6. The electronic system of claim 5, wherein the first integrated IC device package further comprises:
a filler seated to the second carrier connector.

7. The electronic system of claim 6, wherein a major planar top surface of the filler is coplanar with the top surface of the first cover.

8. The electronic system of claim 1, wherein the major planar top surface of the first cabling connector is coplanar with the major planar top surface of the second cabling connector.

\* \* \* \* \*